United States Patent
Kim et al.

(10) Patent No.: US 9,508,699 B2
(45) Date of Patent: Nov. 29, 2016

(54) SEMICONDUCTOR PACKAGE AND METHOD FOR MANUFACTURING THE SAME

(71) Applicant: SK HYNIX INC., Icheon (KR)

(72) Inventors: Jong Hoon Kim, Suwon (KR); Tac Keun Oh, Seoul (KR); Jeong Hwan Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/466,921

(22) Filed: Aug. 22, 2014

(65) Prior Publication Data

US 2015/0303181 A1 Oct. 22, 2015

(30) Foreign Application Priority Data

Apr. 17, 2014 (KR) .................. 10-2014-0046016

(51) Int. Cl.
| | |
|---|---|
| H01L 23/498 | (2006.01) |
| H01L 23/48 | (2006.01) |
| H01L 25/18 | (2006.01) |
| H01L 23/00 | (2006.01) |
| H01L 23/538 | (2006.01) |
| H01L 23/13 | (2006.01) |
| H01L 21/48 | (2006.01) |

(52) U.S. Cl.
CPC ............ *H01L 25/18* (2013.01); *H01L 21/486* (2013.01); *H01L 23/13* (2013.01); *H01L 23/49827* (2013.01); *H01L 23/49838* (2013.01); *H01L 23/5386* (2013.01); *H01L 23/562* (2013.01); *H01L 2224/16225* (2013.01); *H01L 2224/32225* (2013.01); *H01L 2224/73204* (2013.01)

(58) Field of Classification Search
None
See application file for complete search history.

(56) References Cited

U.S. PATENT DOCUMENTS

| | | | | |
|---|---|---|---|---|
| 2004/0184219 | A1* | 9/2004 | Otsuka | H01L 23/49805 361/306.3 |
| 2006/0151870 | A1* | 7/2006 | Nishiyama et al. | 257/700 |
| 2011/0056068 | A1* | 3/2011 | Shioga | H05K 1/162 29/592.1 |
| 2012/0001322 | A1* | 1/2012 | Liu et al. | 257/737 |
| 2012/0286419 | A1* | 11/2012 | Kwon | H01L 23/3107 257/737 |
| 2013/0292830 | A1* | 11/2013 | Liang | G06F 17/5068 257/738 |

FOREIGN PATENT DOCUMENTS

KR 10-2010-0081863 A 7/2010

\* cited by examiner

*Primary Examiner* — Pamela E Perkins

(57) ABSTRACT

A semiconductor package includes an interposer, first and second semiconductor chips horizontally arranged over a first surface of the interposer, the second semiconductor chip being adjacent to the first semiconductor chip, and a thermal expansion reinforcing pattern disposed over a second surface of the interposer.

3 Claims, 15 Drawing Sheets

SEMICONDUCTOR PACKAGE AND METHOD FOR MANUFACTURING THE SAME

CROSS-REFERENCES TO RELATED APPLICATIONS

The present application claims priority under 35 U.S.C 119(a) to Korean Patent Application Number 10-2014-0046016, filed on Apr. 17, 2014, in the Korean Intellectual Property Office, which is incorporated by reference in its entirety as set forth in full.

BACKGROUND

1. Technical Field

Embodiments of the present disclosure relate to a semiconductor device, and more particularly, to a semiconductor package and a method for manufacturing the same.

2. Related Art

Electronic devices are becoming smaller with improved performance, and portable mobile products are increasingly in demand. Thus, ultra-small and large-capacity semiconductor memories are also increasingly in demand. In order to increase the storage capacity of a semiconductor memory, a plurality of semiconductor chips may be mounted in a single package and then assembled.

Methods of forming a single package including multiple chips include a method of mounting a plurality of semiconductor chips in a horizontal direction and a method of mounting a plurality of semiconductor chips in a vertical direction. Among these methods, a method of forming a stack-type multi-chip package in which a plurality of semiconductor chips is vertically stacked is widely used to implement electronic devices having a reduced size. A stack-type multi-chip package has a high chip density in a limited area because a plurality of semiconductor chips is vertically stacked. In stack-type multi-chip packages, through-silicon vias (TSVs) have been proposed to couple the stacked chips. A package using TSVs has a structure in which TSVs penetrate a plurality of chips so as to physically and electrically couple the chips to each other.

Recently, as semiconductor devices are becoming widely used in electronic devices such as mobile devices and home appliances, a system in package (SIP) has been attracting attention. A SIP includes the same or different types of semiconductor devices, which are vertically stacked and coupled to each other through TSVs to form a single package. In an SIP, a plurality of chips is vertically stacked, unlike single-chip package. Thus, the same type of chips may be stacked to increase the storage density, or different types of chips may be arranged to manufacture a package having various functions.

SUMMARY

In an embodiment, a semiconductor package may include: an interposer; first and second semiconductor chips disposed over a first surface of the interposer, the second semiconductor chip spaced apart from the first semiconductor chip horizontally over the first surface of the interposer; and a thermal expansion reinforcing pattern disposed over a second surface of the interposer that is opposite to the first surface.

In another embodiment, a semiconductor package may include: an interposer body having a first surface and a second surface opposite to the first surface; one or more semiconductor chips arranged over the first surface of the interposer body; an insulating layer disposed between the interposer body and the semiconductor chip; and a thermal expansion reinforcing pattern disposed over the second surface of the interposer body.

The semiconductor package may be included in an electronic system, the electronic system further comprising: a memory; and a controller coupled to the memory through a bus, wherein the memory or the controller includes the package.

The semiconductor package may be included in a memory card, the memory card further comprising: a memory; and a controller coupled to the memory through a bus, wherein the memory or the controller includes the package.

In another embodiment, a method of manufacturing a semiconductor package may include: providing an interposer body having a first surface and a second surface; forming a thermal expansion reinforcing pattern over the second surface of the interposer body; and mounting a first semiconductor chip and a second semiconductor chip over the first surface of the interposer body.

DESCRIPTION OF SPECIFIC EMBODIMENTS

Embodiments of the present disclosure will hereinafter be described in detail with reference to the accompanying drawings. It should be noted that the drawings are not to precise scale and components may be illustrated with exaggerated thickness of lines or size for descriptive convenience and clarity. Furthermore, the terms as used herein are defined by taking functions of the embodiment into account and may be changed according to the custom or intention of users or operators. Therefore, definitions of terms should be made in accordance with the overall disclosures set forth herein.

Figure 1:
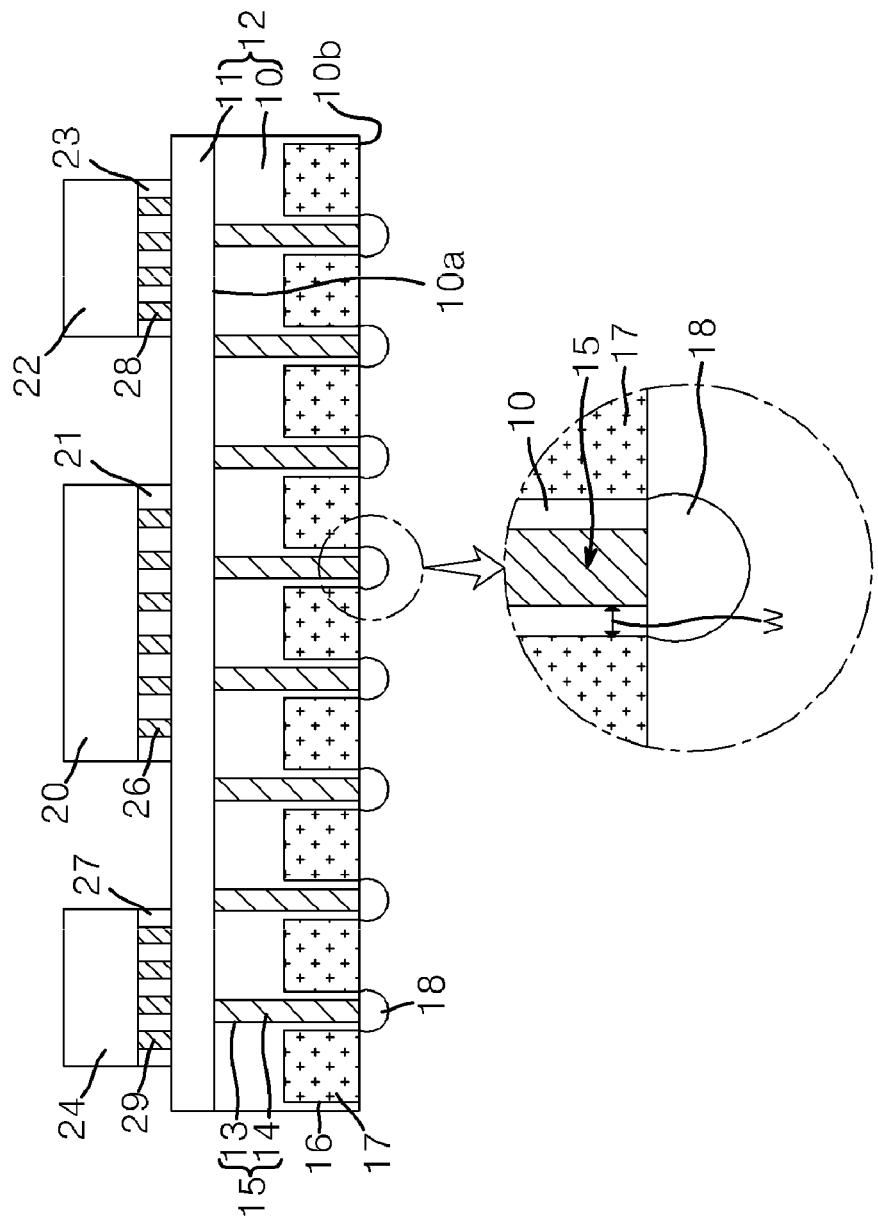
FIG. 1 illustrates a semiconductor package in accordance with an embodiment of the present disclosure.

FIG. 1 illustrates a semiconductor package in accordance with an embodiment of the present disclosure. The semiconductor package includes an interposer 12, a plurality of through silicon vias (TSVs) 15, a first semiconductor chip 20, and second and third semiconductor chips 22 and 24.

The interposer 12 includes an interposer body 10 and a passivation layer 11. The interposer body 10 has a first surface 10a and a second surface 10b. The passivation layer 11 is disposed on the first surface 10a of the interposer body 10. The TSVs 15 pass through the interposer body 10. The first semiconductor chip 20 and the second and third semiconductor chips 22 and 24 are arranged over the passivation layer 11.

The interposer body 10 may be formed of a semiconductor material including silicon (Si) or an insulating material including glass or silicon oxide ($SiO_2$). Each of the TSVs 15 may be formed by filling a through-hole 13 passing through the interposer body 10 with a metallic material 14. The metallic material 14 may include copper (Cu). In an embodiment, an insulating layer (not illustrated) such as silicon oxide is further disposed at an interface between the TSV 15 and the interposer body 10 to prevent the generation of a short circuit or a leakage current between the TSV 15 and the interposer body 10.

The passivation layer 11, which is formed of an insulating material, is disposed on the first surface 10a of the interposer body 10. The insulating material may include nitride or oxide. The passivation layer 11 may include therein circuit wiring patterns (not illustrated) formed of a conductive material.

The first semiconductor chip 20 and the second and third semiconductor chips 22 and 24 are mounted over the passivation layer 11. In an embodiment, the first semiconductor chip 20 may be mounted as a single chip over the interposer 12, and disposed over a central portion of the interposer 12, as shown in the cross-sectional view of FIG. 1. In an embodiment, the first semiconductor chip 20 is a system on chip (SoC) including logic elements and the like. Each of the second and third semiconductor chips 22 and 24 may have a structure in which two or more semiconductor chips having a high degree of integration and high storage capacity, for example, semiconductor memory chips, are vertically stacked.

The first semiconductor chip 20 is electrically coupled to the interposer 12 through first coupling electrodes 26, and the second and third semiconductor chips 22 and 24 are electrically coupled to the interposer 12 through second coupling electrodes 28 and third coupling electrodes 29, respectively. A first insulating layer 21 is disposed between adjacent first coupling electrodes 26, a second insulating layer 23 is disposed between the second coupling electrodes 28, and a third insulating layer 27 is disposed between the third coupling electrodes 29. The first insulating layer 21 or the second and third insulating layers 23 and 27 may be an underfill material. The underfill material may include a silicon resin and/or epoxy resin.

Furthermore, the passivation layer 11, which has disposed therein circuit wiring patterns (not illustrated) formed of a conductive material, is disposed between the interposer body 10 and the first, second, and third semiconductor chips 20, 22, and 24. The first semiconductor chip 20 and the second and third semiconductor chips 22 and 24 may be electrically coupled to the TSVs 15 through the circuit wiring patterns within the passivation layer 11. A first end surface of the TSV 15 is exposed at the first surface 10a of the interposer body 10 and coupled to the passivation layer 11, and a second end surface of the TSV 15 is exposed at the second surface 10b of the interposer body 10. In an embodiment, the second end surface of the TSV 15 is coupled to an external coupling terminal 18 such as a solder ball or solder bump. In an embodiment, an interconnection layer (not shown) may be formed to connect the TSV 15 and the external coupling terminal 18, wherein the interconnection layer may be formed by performing a RDL (Redistribution layer) processing.

With respect of the orientation of the figure, thermal expansion reinforcing patterns 17 are disposed in a recess at the bottom of the interposer body 10 so that bottom surfaces of the thermal expansion reinforcing patterns 17 are substantially level with the second surface 10b of the interposer body 10. In an embodiment, recesses 16 are formed in the interposer body 10 by selectively recessing the second surface 10b by a predetermined depth, and the thermal expansion reinforcing patterns 17 are formed by filling the recesses 16 with a thermal expansion reinforcing material. Thus, the thermal expansion reinforcing patterns 17 are disposed in the recesses 16, respectively. The recesses 16 have the predetermined depth from the second surface 10b of the interposer body 10 and are disposed between the TSVs 15. Each of the recesses 16 is separated from the nearest TSV 15 by a predetermined distance w. The thermal expansion reinforcing pattern 17 may be formed of a material having a high coefficient of thermal expansion (CTE). In an embodiment, the thermal expansion reinforcing pattern 17 is formed of a material having a CTE of 5 ppm/° C. or more. The thermal expansion reinforcing pattern 17 has a relatively higher CTE than the interposer body 10 including silicon (Si). The thermal expansion reinforcing pattern 17 may be formed of any one of insulating polymer materials, such as BCB (Benzocyclobutene) and polyimide, or a mixture of one or more polymer materials.

The first semiconductor chip 20 and the second and third semiconductor chips 22 and 24 are arranged over the interposer 12, and the first, second, and third insulating layers 23 and 27 are arranged between the interposer body 10 and the first, second, and third semiconductor chips 20, 22, and 24, respectively. In an embodiment, the interposer body 10, the passivation layer 11, and the first insulating layer 21 and the second and third insulating layers 23 and 27 are formed of materials having a different CTE, respectively.

In general, the passivation layer 11, the first insulating layer 21 and the second and third insulating layers 23 and 27 have a relatively higher CTE than the interposer body 10 including silicon (Si). The passivation layer 11, the first insulating layer 21 and the second and third insulating layers 23 and 27 are relatively sensitive to thermal changes and tend to expand or contract in response to thermal changes. Thus, deformation of the interposer 12 may result. For example, when the temperature is cooled down, the passivation layer 11, the first insulating layer 21 and the second and third insulating layers 23 and 27 contract more than the interposer body 10. As a result, a first bending force may be applied toward the first surface 10a of the interposer body 10, and thus the first surface 10a of the interposer 12 may be bent to an upward direction. On the other hand, when the temperature is heated, the passivation layer 11, the first insulating layer 21 and the second and third insulating layers 23 and 27 expand more than the interposer body 10. As a result, a second bending force may be applied toward the second surface 10b of the interposer body 10, and thus the first surface 10a of the interposer 12 may be bent to a downward direction.

However, in a semiconductor package having thermal expansion reinforcing patterns 17 in accordance with the embodiment of the present disclosure, when the interposer 12 is cooled down or heated, the stress applied to the second surface 10b may be offset by the thermal expansion reinforcing patterns 17 disposed close to the second surface 10b of the interposer body 10. Thus, it is possible to substantially prevent deformation of the interposer 12

Figure 2:
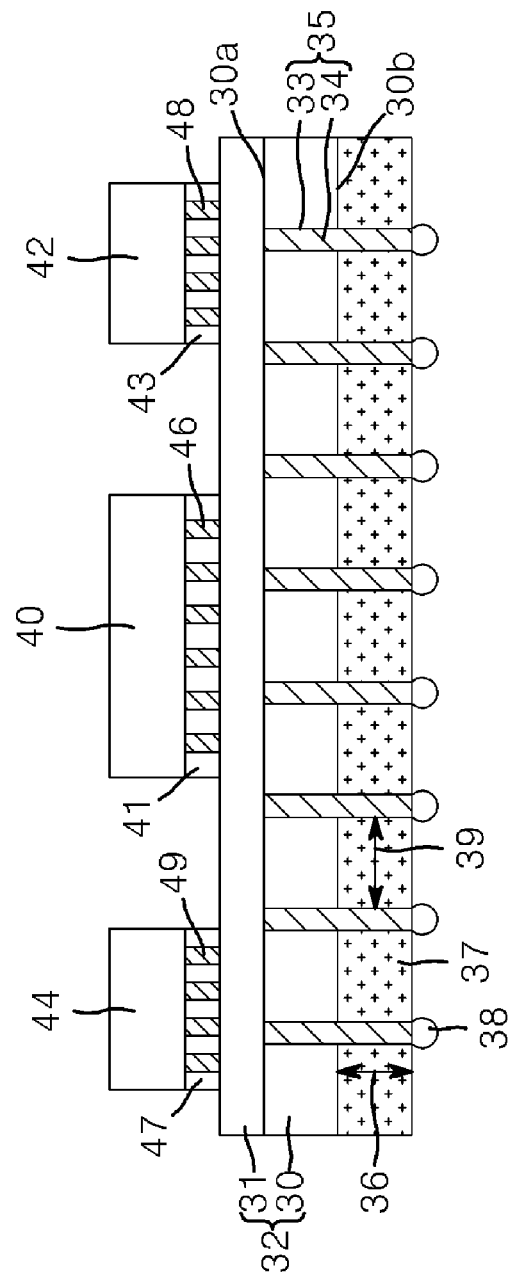
FIG. 2 illustrates a semiconductor package in accordance with another embodiment of the present disclosure.

FIG. 2 illustrates a semiconductor package in accordance with another embodiment of the present disclosure. The semiconductor package includes an interposer 32, a plurality of TSVs 35, a plurality of thermal expansion reinforcing patterns 37, a first semiconductor chip 40, and second and third semiconductor chips 42 and 44.

The interposer 32 includes an interposer body 30 and a passivation layer 31. The interposer body 30 has a first surface 30a and a second surface 30b, and the passivation layer 31 is disposed on the first surface 30a. Each of the TSVs 35 passes through the interposer body 30 and has a protruding portion, which protrudes from the second surface 30*b* by a predetermined height and into the thermal expansion reinforcing patterns 37. The thermal expansion reinforcing patterns 37 are disposed on the second surface 30*b* of the interposer body 30 below the interposer body 30 and between the protruding portions of the TSVs 35. The first semiconductor chip 40 and the second and third semiconductor chips 42 and 44 are arranged over the passivation layer 31.

The interposer body 30 may include Si, glass or $SiO_2$. Each of the TSVs 35 passes through the interposer body 30 from the first surface 30*a* to the second surface 30*b* and protrudes by a predetermined height 36 from the second surface 30*b*. In an embodiment, an insulating layer (not illustrated) such as silicon oxide is further disposed at an interface between the TSV 35 and the interposer body 30 to prevent the generation of a short circuit or a leakage current between the TSV 35 and the interposer body 30. The TSV 35 includes a metallic material layer 34 filling a through-hole 33.

The passivation layer 31 formed of an insulating material is disposed on the first surface 30*a* of the interposer body 30. The passivation layer 31 may include therein circuit wiring patterns (not illustrated) formed of a conductive material.

The first semiconductor chip 40 and the second and third semiconductor chips 42 and 44, which are arranged on opposite sides of the first semiconductor chip 40, respectively, are mounted over the passivation layer 31. The first semiconductor chip 40 may be mounted as a single chip, and each of the second and third semiconductor chips 42 and 44 may have a stacked structure of two or more chips. The first semiconductor chip 40 is electrically coupled to the interposer 32 through first coupling electrodes 46, and the second and third semiconductor chips 42 and 44 are electrically coupled to the interposer 32 through second and third coupling electrodes 48 and 49, respectively. A first insulating layer 41 is disposed between the first coupling electrodes 46, a second insulating layer 43 is disposed between the second coupling electrodes 48, and a third insulating layer 47 is disposed between the third coupling electrodes 49. The first insulating layer 41 or the second and third insulating layers 43 and 47 may include an underfill material. The underfill material may include a silicon resin and/or epoxy resin.

The passivation layer 31 of the interposer 32 may have disposed therein circuit wiring patterns (not illustrated), and the first semiconductor chip 40 and the second and third semiconductor chips 42 and 44 may be electrically coupled to the TSVs 35 through the circuit wiring patterns.

A first end surface of the TSV 35 may be coupled to the passivation layer 31, and a second end surface of the TSV 35 may be exposed at the second surface 30*b* of the interposer body 30. In an embodiment, the second end surface of the TSV 35 may be coupled to an external coupling terminal 38 such as a solder ball or solder bump.

The thermal expansion reinforcing patterns 37 are disposed on the second surface 30*b* of the interposer body 30. In an embodiment, when the TSVs 35 are formed, the TSVs 35 protrude by the predetermined height 36 from the second surface 30*b* of the interposer body 30, and are exposed to the outside. As a result, a space 39 is formed between adjacent TSVs 35. The thermal expansion reinforcing pattern 37 may fill the space 39 between the adjacent TSVs 35 on the second surface 30*b* of the interposer body 30. One surface of the thermal expansion reinforcing pattern 37 may be in contact with the second surface 30*b*, and the other surface of the thermal expansion reinforcing pattern 37 may be substantially level with the second end surface of the TSV 35. The thermal expansion reinforcing pattern 37 may be formed of a material having a high CTE. In an embodiment, the thermal expansion reinforcing pattern 37 is formed of a material having a CTE of 5 ppm/° C. or more. The thermal expansion reinforcing pattern 37 has a relatively higher CTE than the interposer body 30 including silicon (Si). Specifically, the thermal expansion reinforcing pattern 37 may be formed of any one of insulating polymer materials, such as BCB and polyimide, or a mixture of one or more polymer materials.

Since the thermal expansion reinforcing patterns 37 are disposed on the second surface 30*b* of the interposer body 30 between the TSVs 35, stress that occurs due to differences of CTEs of the interposer body 30, the passivation layer 31, and the first insulating layer 41 or the second and third insulating layers 43 and 47 may be offset by the thermal expansion reinforcing patterns 37. Thus, it is possible to substantially prevent deformation of the interposer 32.

The present embodiment may also be applied to an interposer having wiring patterns formed on a first surface of an interposer body without TSVs.

FIGS. 3 to 9 illustrate a method of fabricating the semiconductor package of FIG. 1 in accordance with an embodiment of the present disclosure.

Figure 3:
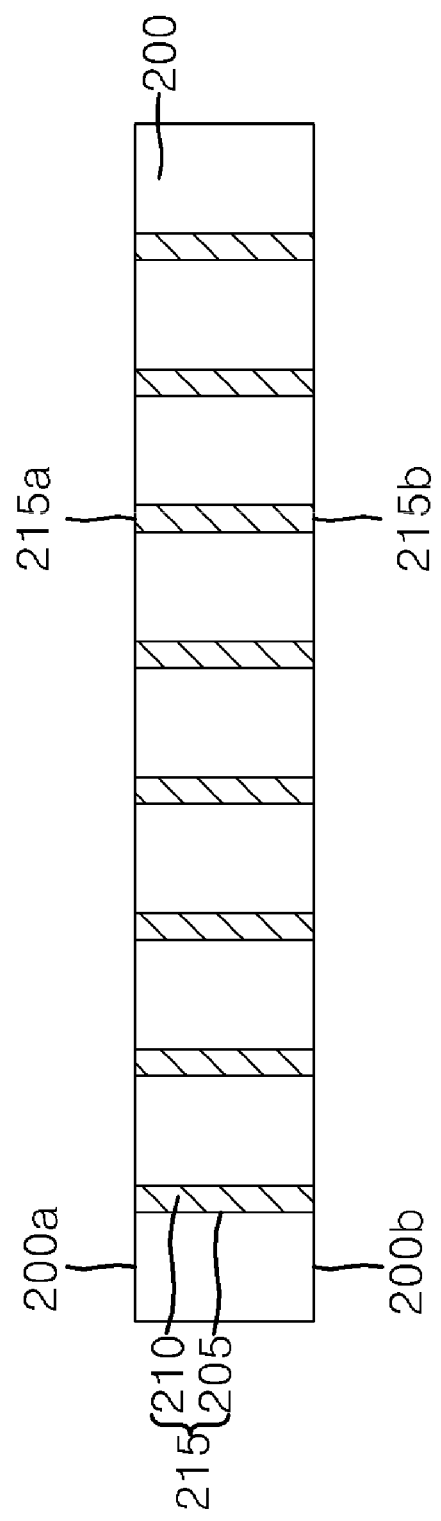
FIGS. 3 to 9 illustrate a method of manufacturing a semiconductor package in accordance with an embodiment of the present disclosure.

Referring to FIG. 3, an interposer body 200 and a plurality of TSVs 215 disposed in the interposer body 200 are provided.

The interposer body 200 may include a substrate formed of a semiconductor material including Si or an insulating substrate formed of glass. Each of the TSVs 215 is formed as a trench or hole 205 penetrating the interposer body 200 and filled with a metallic material 210. The hole 205 has a predetermined depth from a first surface 200*a* to a second surface 200*b* of the interposer body 200.

The plurality of TSVs 215 may be spaced apart from each other by a predetermined distance in the interposer body 200 when a plurality of semiconductor chips each having a stacked structure is arranged over the interposer 202. The metallic material 210 filling the trench or hole 205 may include Cu, Ag, Sn, or a combination thereof.

In an embodiment, an insulating layer (not illustrated) such as silicon oxide is further disposed at an interface between the TSV 215 and the interposer body 200 to prevent the generation of a short circuit or a leakage current between the TSV 215 and the interposer body 200. The insulating layer may be omitted when the interposer body 200 is formed of an insulating substrate such as glass.

The TSV 215 has a first end surface 215*a* substantially level with the first surface 200*a* of the interposer body 200 and a second end surface 215*b* substantially level with the second surface 200*b* of the interposer body 200. The first end surface 215*a* and the second end surface 215*b* may be exposed to the outside of the hole 205.

Figure 4:
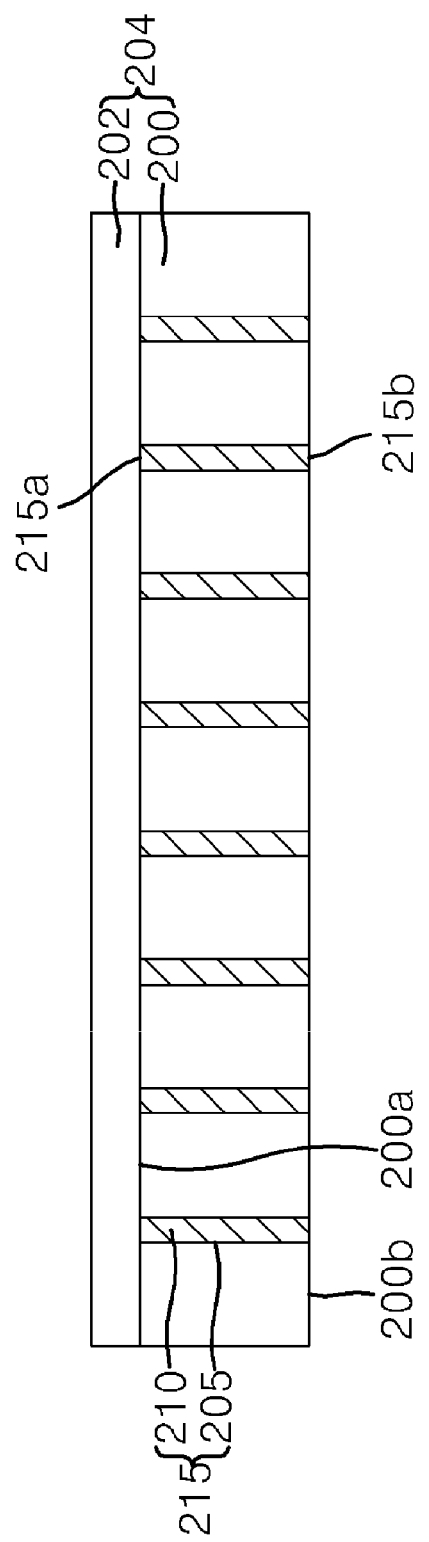

Referring to FIG. 4, a passivation layer 202 is formed over the first surface 200*a* of the interposer body 200. The passivation layer 202 may be formed of an insulating material such as nitride or oxide. The passivation layer 202 may include therein circuit wiring patterns (not illustrated) formed of a conductive material. Thus, an interposer 204 including the interposer body 200 and the passivation layer 202 disposed over the interposer body 200 is provided.

Figure 5:
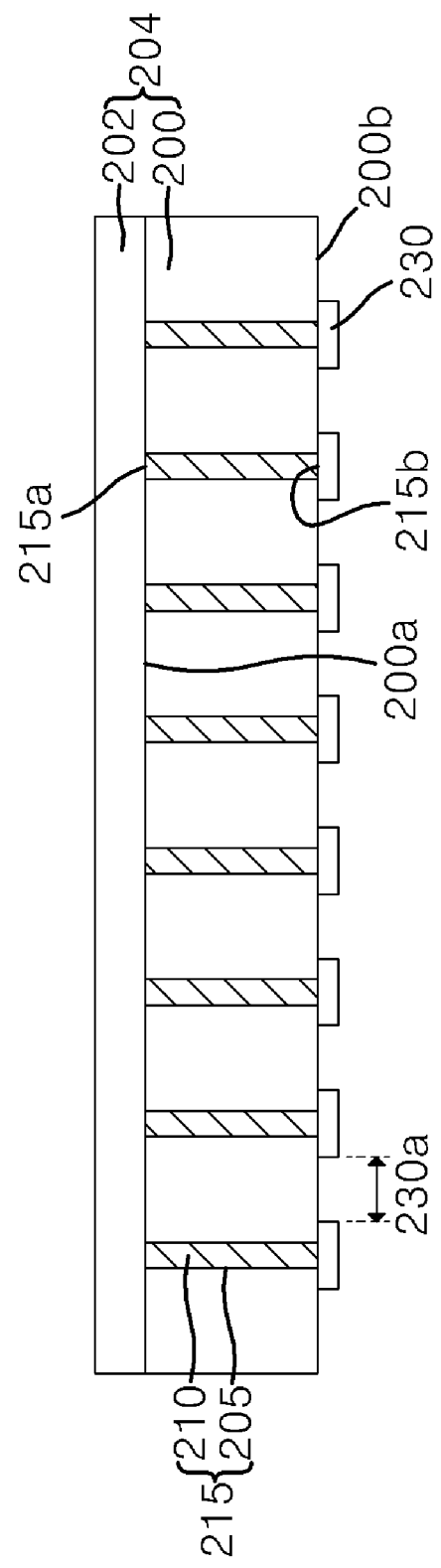

Referring to FIG. 5, a mask pattern 230 is formed on the second surface 200*b* of the interposer body 200 to partially expose the second surface 200*b* of the interposer body 200 and to cover the second end surface 215*b* of each TSV 215. In order to form the mask pattern 230, a mask material such as photoresist is applied on the second surface 200b of the interposer body 200. Then, a lithography process including exposure and development processes is performed on the photoresist so that the mask pattern 230 having openings 230a is formed. The mask pattern 230 partially exposes the second surface 200b of the interposer body 200 through the openings 230a. As a result, the mask pattern 230 may cover the second end surfaces 215b of the TSVs 215 and parts of the second surface 200b of the interposer body 200. Each of the openings 230a of the mask pattern 230 defines a region for forming a recess.

Figure 6:
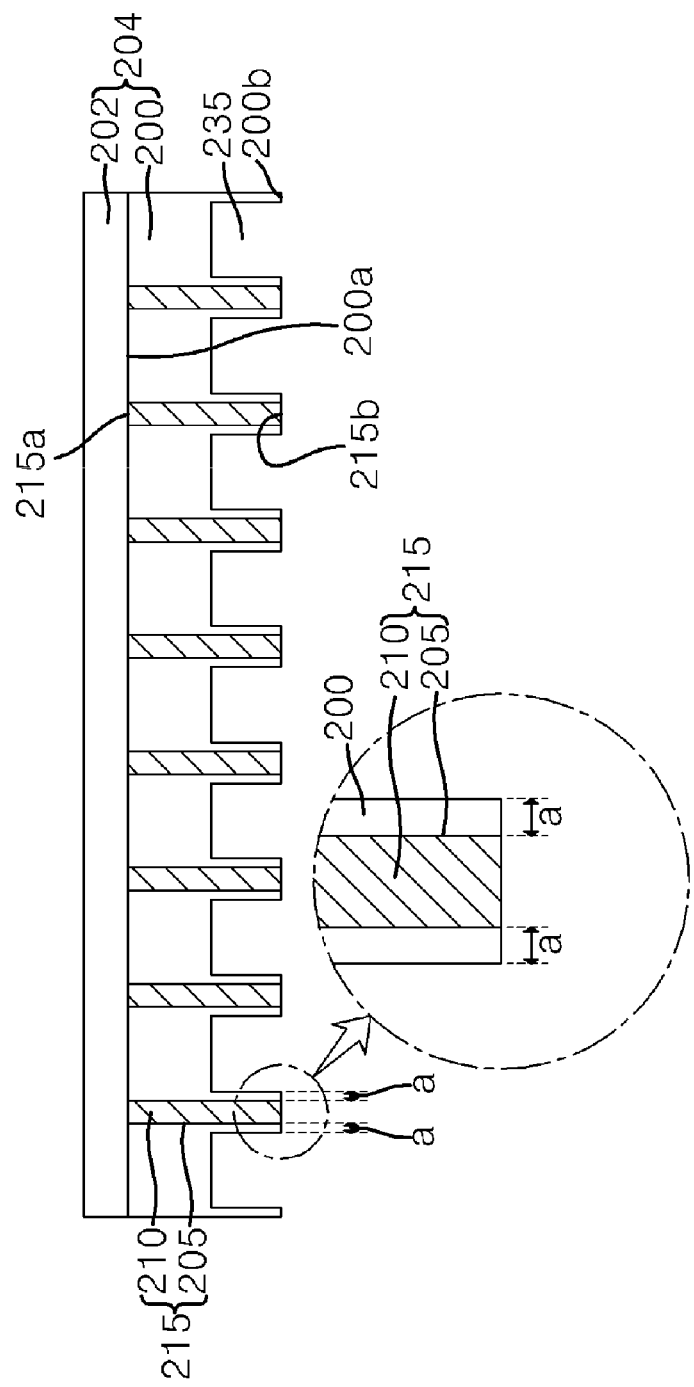

Referring to FIG. 6, recesses 235 are formed in the interposer body 200 and have a predetermined depth from the second surface 200b to the first surface 200a of the interposer body 200. To form the recesses 235, an etch process is performed on the second surface 200b of the interposer body 200 using the mask pattern 230 (refer to FIG. 5) as an etch mask. The etch process may include a selective dry etch process using plasma. As a result of the etch process, the recesses 235 are formed in the interposer body 200 between the TSVs 215. After that, the mask pattern 230 is removed. As the mask pattern 230 is removed, the regions covered by the mask pattern 230, for example, the second end surfaces 215b of the TSVs 215 and parts of the second surface 200b of the interposer body 200 adjacent to the second end surfaces 215b, are exposed. Each of the parts of the second surface 200b of the interposer body 200 adjacent to the second end surface 215b is indicated by 'a' in FIG. 6.

Figure 7:
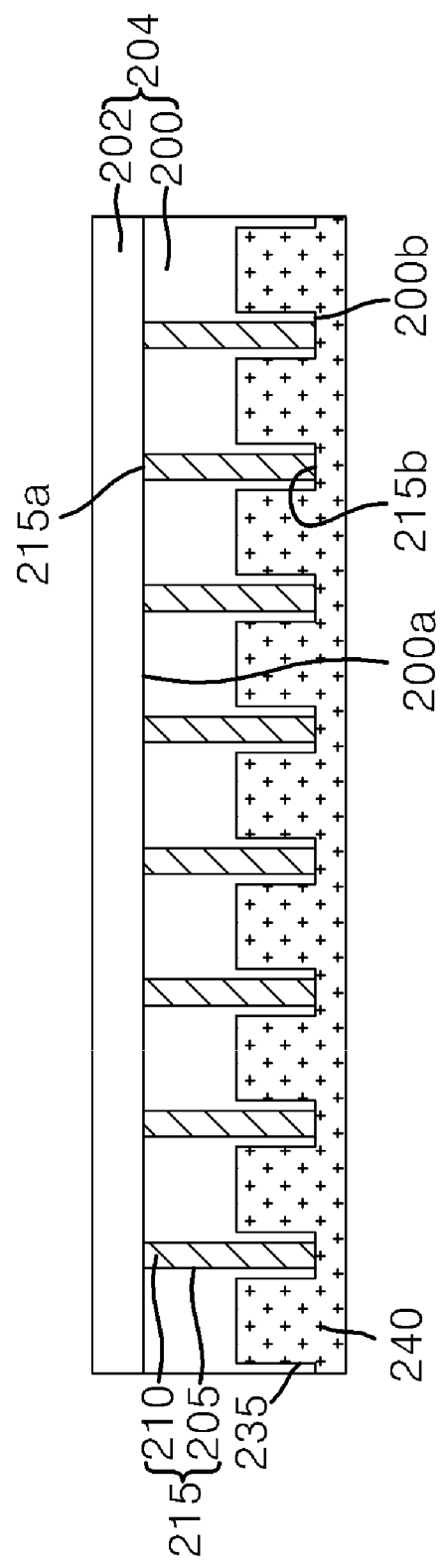

Referring to FIG. 7, a thermal expansion reinforcing layer 240 is formed to fill the recesses 235 formed in the interposer body 200. The thermal expansion reinforcing layer 240 may be formed by applying a liquid or a material in a gel state through a spin-coating method. The thermal expansion reinforcing layer 240 may have such a thickness as to fully fill the recesses 235 formed in the interposer body 200 and to cover the second end surfaces 215b of the TSVs 215. The thermal expansion reinforcing layer 240 may be formed of a material having a high CTE. In an embodiment, the thermal expansion reinforcing layer 240 is formed of a polymer material having a CTE of 5 ppm/° C. or more. The thermal expansion reinforcing layer 240 has a relatively higher CTE than the interposer body 200 including silicon (Si). Specifically, the thermal expansion reinforcing layer 240 has a CTE of 5 ppm/° C. or more while the interposer body 200 including silicon (Si) has a CTE of 2.6 ppm/° C. Accordingly, the thermal expansion reinforcing layer 240 is formed of a material having a CTE of 5 ppm/° C. or more, stress that occurs due to differences of CTEs may be offset. In an embodiment, the thermal expansion reinforcing layer 240 is formed of any one of insulating polymer materials, such as BCB and polyimide, or a mixture of one or more polymer materials.

Figure 8:
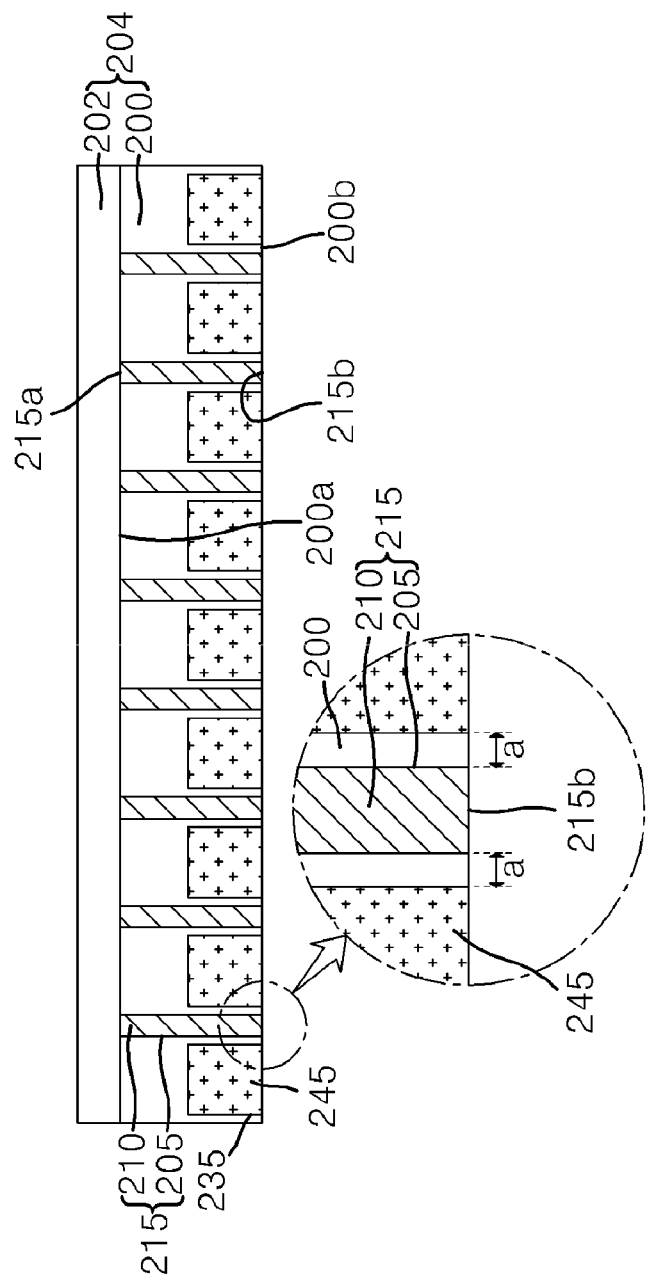

Referring to FIG. 8, a planarization process is performed on the thermal expansion reinforcing layer 240 (refer to FIG. 7) until the second end surfaces 215b of the TSVs 215 and the portions 'a' of second surface 200b of the interposer body 200 are exposed. As a result, thermal expansion reinforcing patterns 245 are formed filling the recesses 235 in the interposer body 200. The planarization process may include a chemical mechanical polishing (CMP) process. However, embodiments are not limited thereto. In another embodiment, the thermal expansion reinforcing layer 240 may be etched or removed through a dry etch process using plasma.

Figure 9:
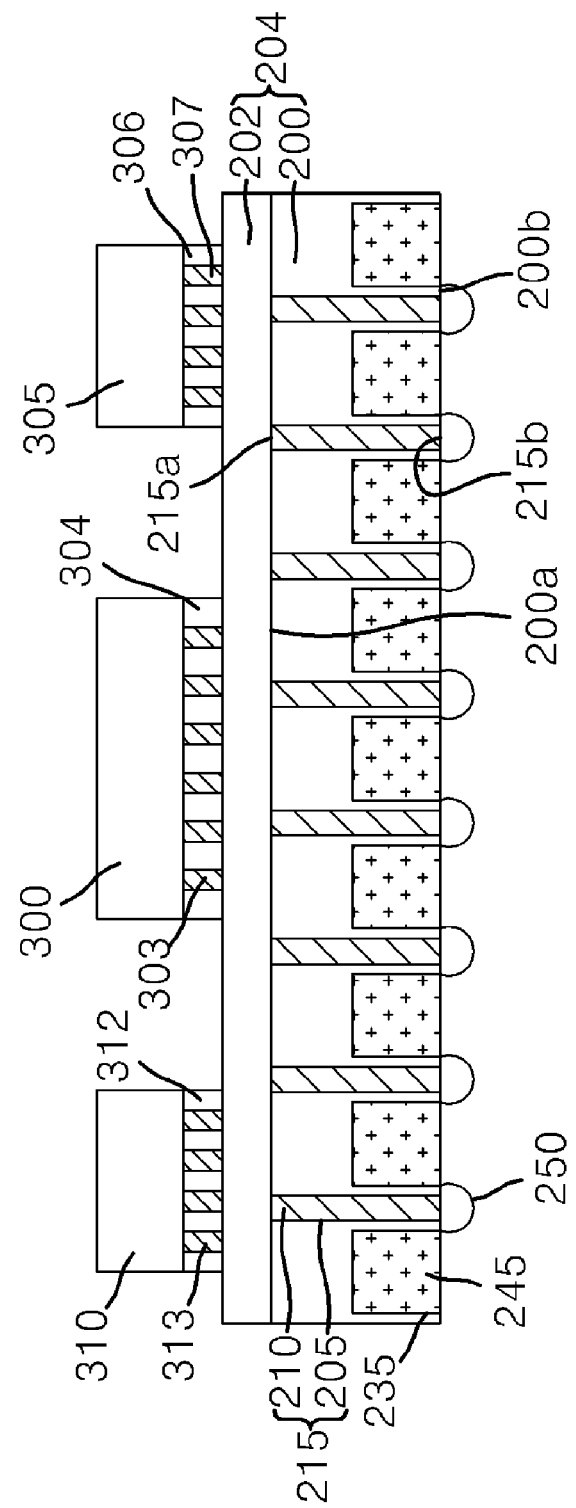

Referring to FIG. 9, first, second, and third semiconductor chips 300, 305, and 310 are arranged over the passivation layer 202 of the interposer 204. As shown in FIG. 9, the first, second, and third semiconductor chips 300, 305, and 310 are spaced apart from each other horizontally over the passivation layer 202. The first semiconductor chip 300 may be a system on chip (SoC), and include semiconductor devices such as a memory, a microprocessor, and logic elements. The second and third semiconductor chips 305 and 310 are disposed on opposite sides of the first semiconductor chip 300, respectively, and may include memory devices such as DRAMs. When the second and third semiconductor chips 305 and 310 are memory devices, each of the second and third semiconductor chips 305 and 310 may have a stacked structure of two or more chips. FIG. 9 illustrates that the first semiconductor chip 300 and the second and third semiconductor chips 305 and 310 have substantially the same height. However, if one or both of the second and third semiconductor chips 305 and 310 has a stacked structure of a plurality of chips, the chips may be vertically stacked, and the second and/or third semiconductor chips 305 and 310 having the stacked structure may have a different height from the first semiconductor chip 300.

Under the first, second, and third semiconductor chips 300, 305, and 310, first coupling electrodes 303, second coupling electrodes 307, and third coupling electrodes 313 are arranged, respectively. The first, second, and third coupling electrodes 303, 307, and 313 electrically couple the interposer 204 to the first, second, and third semiconductor chips 300, 305, and 310, respectively. In an embodiment, a first insulating layer 304 is disposed between the first coupling electrodes 303. Furthermore, a second insulating layer 306 is disposed between the second coupling electrodes 307, and a third insulating layer 312 is disposed between the third coupling electrodes 313. The first insulating layer 304, the second insulating layer 306, and the third insulating layer 312 may be formed of an underfill material such as epoxy resin.

Since the passivation layer 202 having circuit wiring patterns (not illustrated) therein is disposed between the interposer body 200 and the first, second, and third semiconductor chips 300, 305, and 310, the first, second, and third semiconductor chips 300, 305, and 310 may be electrically coupled to the TSVs 215 through the circuit wiring patterns included in the passivation layer 202.

Then, external coupling electrodes 250 are formed on the second end surfaces 215b of the TSVs 215 and the exposed parts of the second surface 200b of the interposer body 200. The external coupling electrodes 250 may include a solder ball, a solder bump, or a conductive bump.

As the thermal expansion reinforcing patterns 245 are disposed in the interposer body 200, the expansion or contraction of the interposer body 200 at the first surface 200a, which occurs when the temperature of the semiconductor package increases or decreases, may be offset by an expanding or contracting volume of the thermal expansion reinforcing patterns 245 disposed adjacent to the second surface 200b of the interposer body 200. Thus, it is possible to substantially prevent deformation of the interposer body 200.

Then, although not illustrated, after the first, second, and third semiconductor chips 300, 305, and 310 are arranged over the interposer 204, a molding material layer is formed to fully cover the first, second, and third semiconductor chips 300, 305, and 310, and then the molding material layer is planarized to form a system in package in which the first, second, and third semiconductor chips 300, 305, and 310 are buried in the molding material layer.

Hereafter, a method for manufacturing the semiconductor package of FIG. 2 in accordance with an embodiment of the present disclosure will be described with reference to FIGS. 10 to 14. Descriptions for components or features that are substantially the same as those in the semiconductor package of FIG. 1 may be omitted for simplicity of explanation.

Figure 10:
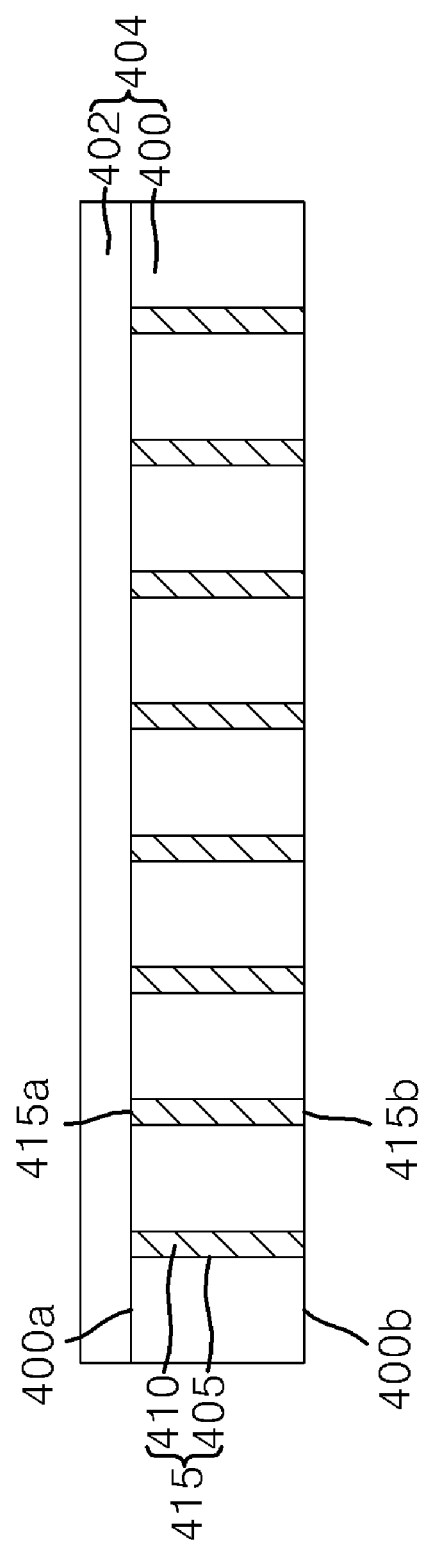
FIGS. 10 to 14 illustrate a method of manufacturing a semiconductor package in accordance with another embodiment of the present disclosure.

Referring to FIG. 10, an interposer 404 including an interposer body 400 and a passivation layer 402 is provided. The interposer body 400 has a first surface 400a and a second surface 400b, and the passivation layer 402 is formed on the first surface 400a. The interposer body 400 may include a substrate formed of silicon (Si) or glass.

A plurality of TSVs 415 is formed in the interposer body 400. Each of the TSVs 415 is formed as a trench or hole 405 passing through the interposer body 400 and filled with a metallic material 410. The hole 405 has a predetermined depth from the first surface 400a to the second surface 400b of the interposer body 400. The plurality of TSVs 415 may be spaced apart from each other by a predetermined distance in the interposer body 400. The metallic material 410 filling the hole 405 may include Cu, Ag, Sn, or a combination thereof.

In an embodiment, an insulating layer (not illustrated) such as silicon oxide is further disposed at an interface between the TSV 415 and the interposer body 400 to prevent the generation of a short circuit or a leakage current between the TSV 415 and the interposer body 400. The insulating layer may be omitted when the interposer body 400 is formed of an insulating substrate such as glass.

The TSV 416 has a first end surface 415a and a second end surface 415b. The first end surface 415a may be level with the first surface 400a of the interposer body 400, and the second end surface 415b may be level with the second surface 400b of the interposer body 400.

The passivation layer 402 disposed on the first surface 400a of the interposer body 400 may be formed of an insulating material such as nitride or oxide. The passivation layer 402 may include therein circuit wiring patterns (not illustrated) formed of a conductive material.

Figure 11:
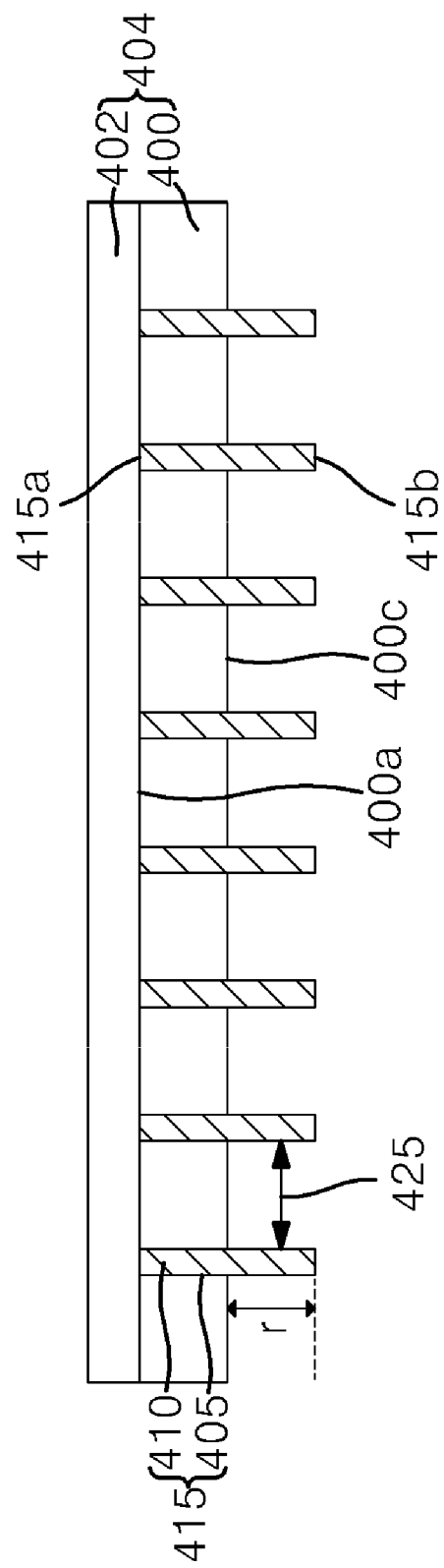

Referring to FIG. 11, a predetermined thickness r of portions of the interposer body 400 is removed from the second surface 400b of FIG. 10 so that the TSVs 415 are partially exposed. To partially expose the TSVs 415, a selective etch process of etching only the interposer body 400 while leaving the TSVs 415 may be performed on the interposer body 400 so that the interposer body 400 is recessed from the second end surface 415b of the TSVs 415 by the predetermined thickness r. The selective etch process may include a dry etch or wet etch process. The dry etch process may be performed using plasma. As a result, the TSVs 415 protrude by a predetermined height r from the recessed second surface 400c of the interposer body 400. A space 425 may be formed between protruding portions of the TSVs 415.

Figure 12:
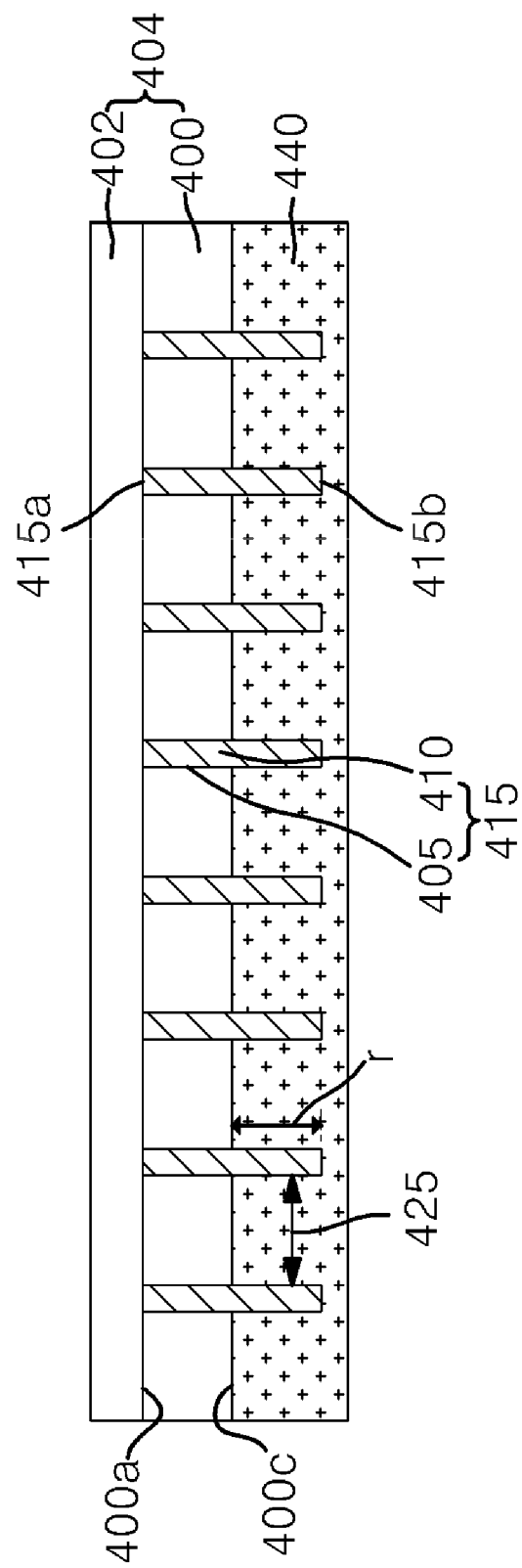

Referring to FIG. 12, a thermal expansion reinforcing layer 440 is formed on the recessed second surface 400c of the interposer body 400. The thermal expansion reinforcing layer 440 may be formed by applying a polymer material through a spin-coating method. The thermal expansion reinforcing layer 440 may have such a thickness as to cover the recessed second surface 400c of the interposer body 400, the protruding portions of the TSVs 415, and the spaces 425 between the respective TSVs 425. The thermal expansion reinforcing layer 440 may be formed of a material having a high CTE. In an embodiment, the thermal expansion reinforcing layer 440 is formed of a material having a CTE of 5 ppm/° C. or more. In an embodiment, the thermal expansion reinforcing layer 440 may be formed of any one selected from insulating polymer materials, such as BCB and polyimide, or a mixture of one or more polymer materials.

Figure 13:
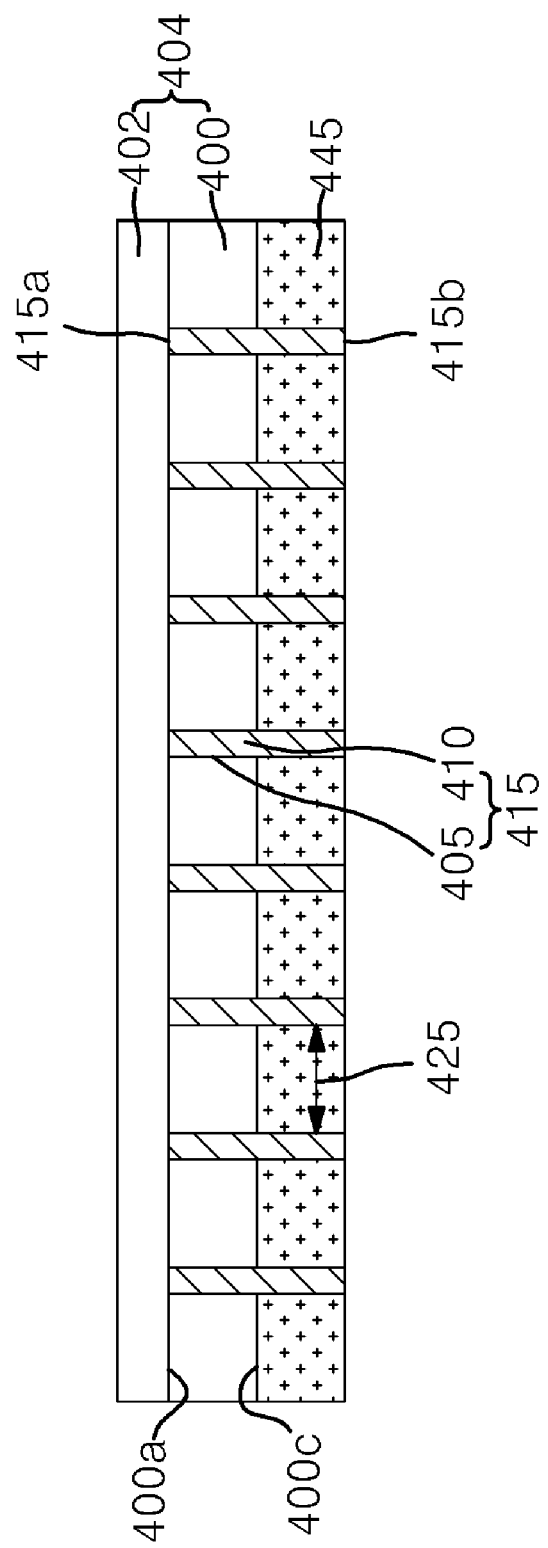

Referring to FIG. 13, a planarization process is performed on the thermal expansion reinforcing layer 440 to form thermal expansion reinforcing patterns 445. The planarization process may include a CMP process. The planarization process may be performed until the second end surfaces 415b of the TSVs 415 are exposed. The thermal expansion reinforcing patterns 445 fill the spaces 425 between the TSVs 415, respectively.

Figure 14:
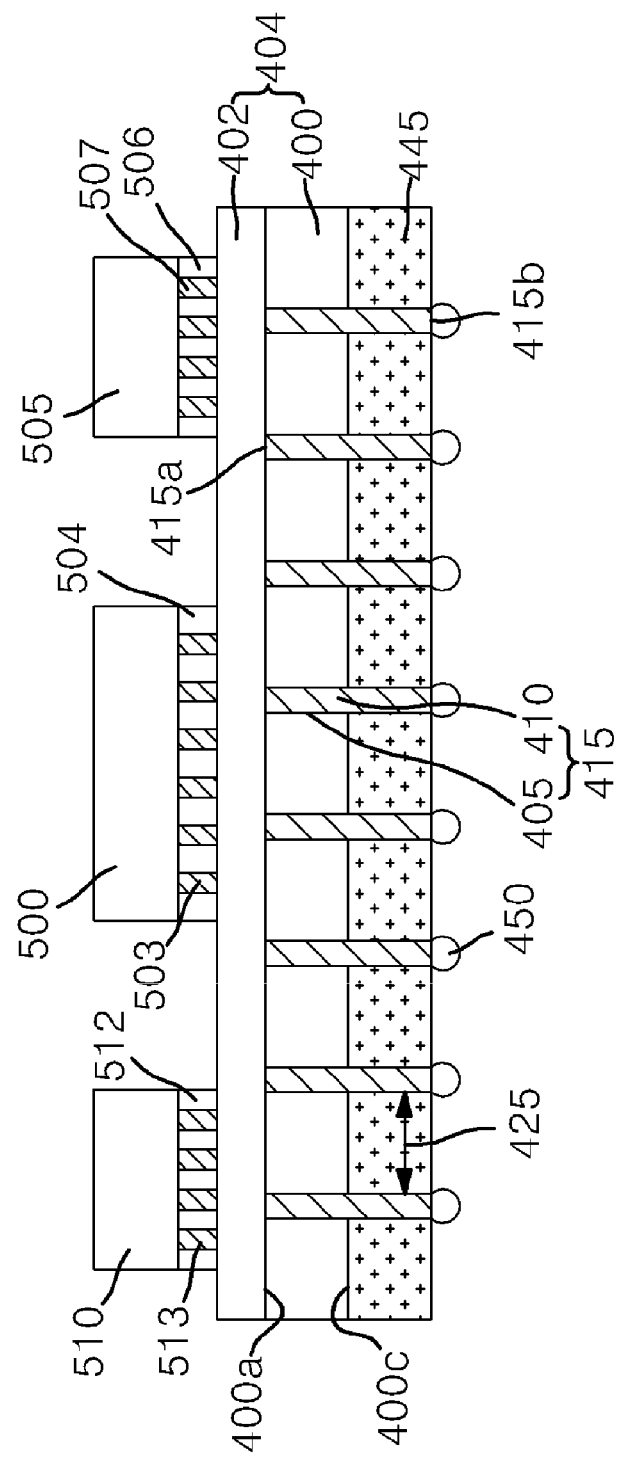

Referring to FIG. 14, a first semiconductor chip 500 and second and third semiconductor chips 505 and 510 are arranged over the passivation layer 402 of the interposer 404.

The first semiconductor chip 500 may be a system on chip (SoC), and include semiconductor devices such as a memory, a microprocessor, and logic elements. As shown in the cross-sectional view of FIG. 14, the first semiconductor chip 500 may be arranged over a central region of the interposer 404, and the second and third semiconductor chips 505 and 510 may be arranged on opposite sides of the first semiconductor chip 500, respectively. The second and third semiconductor chips 505 and 510 may include memory devices. When the second and third semiconductor chips 505 and 510 include memory devices, the second and third semiconductor chips 505 and 510 may have a structure in which two or more chips are stacked in a vertical direction.

FIG. 14 illustrates that the first semiconductor chip 500 and the second and third semiconductor chips 505 and 510 have the same height. However, if one or both of the second and third semiconductor chips 505 and 510 has a stacked structure of a plurality of chips, and the chips are vertically stacked, the second and/or third semiconductor chips 505 and 510 may have a different height from the first semiconductor chip 500.

Under the first semiconductor chip 500 and the second and third semiconductor chips 505 and 510, first coupling electrodes 503, second coupling electrodes 507, and third coupling electrodes 513 are arranged, respectively. The first, second, and third coupling electrodes 503, 507, and 513 electrically couple the interposer 404 to the first, second, and third semiconductor chips 500, 505, and 510, respectively. In an embodiment, a first insulating layer 504 including an underfill material is disposed between the adjacent first coupling electrodes 503, a second insulating layer 506 is disposed between the adjacent second coupling electrodes 507, and a third insulating layer 512 is disposed between the adjacent third coupling electrodes 513.

The first semiconductor chip 500 and the second and third semiconductor chips 505 and 510 may be electrically coupled to the TSVs 415 disposed in the interposer 404 through the circuit wiring patterns (not illustrated) included in the passivation layer 402.

After that, external coupling electrodes 450 are formed on the exposed second end surfaces 415b of the TSVs 415. The external coupling electrodes 450 may include a solder ball, a solder bump, or a conductive bump.

The thermal expansion reinforcing patterns 445 disposed on the recessed second surface 400c of the interposer body 400 may offset stress which contracts or expands the first surface 400a of the interposer body 400, when the interposer 404 is cooled down or heated. Thus, it is possible to substantially prevent the interposer 404 from being bent or deformed.

The packages described above may be applied to various electronic systems.

Figure 15:
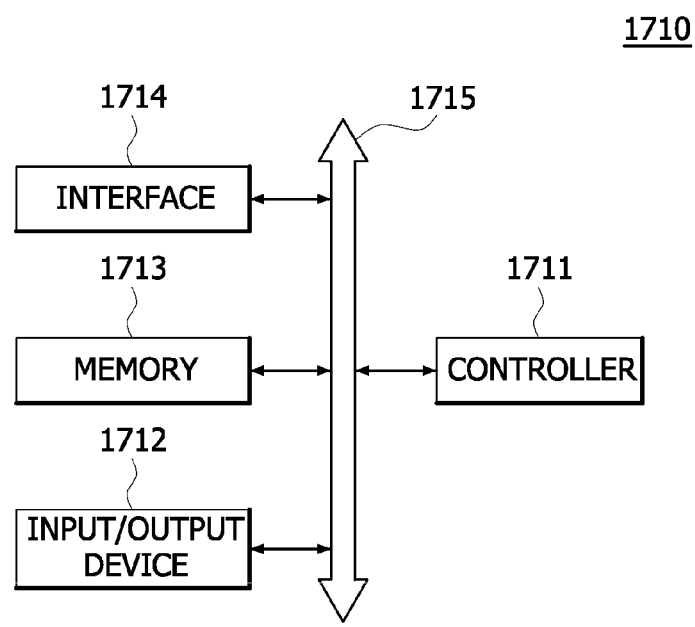
FIG. 15 is a block diagram illustrating an electronic system including a package according to an embodiment.

Referring to FIG. 15, the package in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data are transmitted.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the packages according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Figure 16:
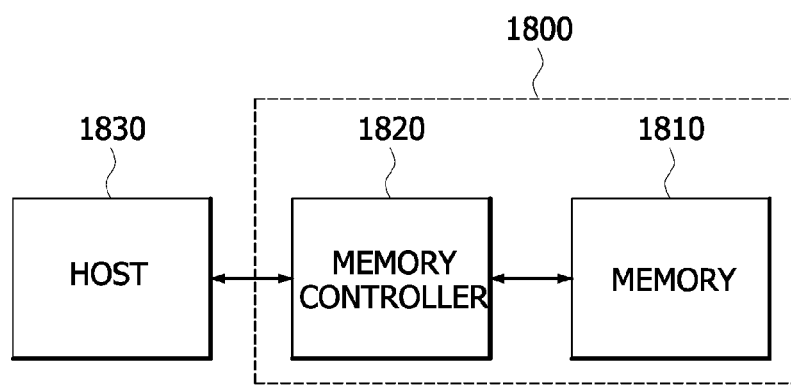
FIG. 16 is a block diagram illustrating another electronic system including a package according to an embodiment.

Referring to FIG. 16, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technologies of the embodiments of the present disclosure are applied. The memory controller 1820 may control the memory 1810 such that stored data is read out or data is stored in response to a read/write request from a host 1830.

Although embodiments of the present disclosure have been described for illustrative purposes, those skilled in the art will appreciate that various modifications, additions and substitutions are possible, without departing from the scope and spirit of the present invention as defined in the accompanying claims.

What is claimed is:

1. A semiconductor package comprising:
an interposer body having a first surface and a second surface opposite to the first surface;
a passivation layer disposed on the first surface of the interposer body;
a thermal expansion reinforcing pattern disposed on the second surface of the interposer body;
a plurality of through-silicon vias (TSVs) penetrating the interposer body and the thermal expansion reinforcing pattern using a single layer so that one part of height of the TSVs is surrounded by the interposer body and the other part of the height of the TSVs is surrounded by the thermal expansion reinforcing pattern;
one or more semiconductor chips arranged over the passivation layer;
a plurality of coupling electrodes disposed on each of surfaces of the semiconductor chips to be electrically coupled to the TSVs; and
an insulating layer filling each of gaps between adjacent coupling electrodes.

2. The semiconductor package of claim 1, wherein the thermal expansion reinforcing pattern is disposed over the entire second surface of the interposer body.

3. The semiconductor package of claim 1, wherein the one or more semiconductor chips comprise first and second semiconductor chips disposed over the passivation layer, the second semiconductor chip being horizontally spaced apart from the first semiconductor chip over the passivation layer.

* * * * *